United States Patent [19]
Pei et al.

[11] Patent Number: 6,059,596
[45] Date of Patent: May 9, 2000

[54] ZERO INSERTION FORCE SOCKET

[75] Inventors: Wen-Chun Pei, Taipei; Yu-Sung Lee, Yung-Ho, both of Taiwan

[73] Assignee: Hon Hai Precision Ind. Co., Ltd., Taipei Hsien, Taiwan

[21] Appl. No.: 09/387,417

[22] Filed: Aug. 31, 1999

[30] Foreign Application Priority Data

Apr. 16, 1999 [TW] Taiwan .................................. 88205886

[51] Int. Cl.[7] ................................................. H01R 13/62
[52] U.S. Cl. ............................................................ 439/342
[58] Field of Search ........................... 439/342, 259–270, 439/70–73

[56] References Cited

U.S. PATENT DOCUMENTS

| | | | |
|---|---|---|---|
| 4,988,310 | 1/1991 | Bright et al. | 439/342 |
| 5,489,218 | 2/1996 | McHugh | 439/342 |
| 5,679,020 | 10/1997 | Lai et al. | 439/342 |
| 5,730,615 | 3/1998 | Lai et al. | 439/342 |

*Primary Examiner*—Gary F. Paumen
*Attorney, Agent, or Firm*—Wei Te Chung

[57] ABSTRACT

A zero insertion force (ZIF) socket comprises a dielectric base defining a number of contact receiving passageways for receiving a number of contacts therein and forming a pair of platforms outwardly extending from opposite lateral edges thereof, a slidable cover defining a number of pin receiving passageways for receiving corresponding pins of an IC package therein, and a resilient retention member received in one of the platforms of the base for locking the cover with the base in position thereby ensuring excellent electrical connection between the IC package and the ZIF socket.

8 Claims, 7 Drawing Sheets

ZERO INSERTION FORCE SOCKET

BACKGROUND OF THE INVENTION

The present invention relates to a zero insertion force (ZIF) socket, and especially to a ZIF socket which ensures stable reliable electrical connection between an IC package and a circuit board without the help of a cam lever.

A conventional ZIF socket are disclosed in U.S. Pat. Nos. 5,489,218, and 5,679,020. Such conventional ZIF socket commonly has a cam attached between a base and a slidable cover for driving the slidable cover to slide along a top surface of the base from an original position to a final position. In the original position, pins of an IC package do not contact with the corresponding terminals fixed in the base. When the cover is driven by the cam to the final position, the pins of the IC package are properly positioned to electrically contact the corresponding terminals of the ZIF socket, and the cover is secured with the base at the final position. The cam is usually fixed to a lateral side of the ZIF socket, thus, the cam occupies a relatively large space and does not promote miniaturization of the ZIF socket.

A conventional ZIF socket without a cam is disclosed in U.S. Pat. No. 5,730,615. The ZIF socket comprises a base and a cover. Two expansion sections laterally extend from the base and the cover, respectively. Each expansion section defines a receiving slot therein whereby the cover is actuated to move in a front-to-end direction by inserting a flat tool into the receiving slots of both the base and the cover, and successively moving the flat tool in the receiving slots rearwardly and forwardly, whereby terminals fixed in the base electrical contact with corresponding pins of an IC package, which are positioned within the cover.

However, the conventional ZIF socket without a cam does not include a retention member to lock a cover of the ZIF socket at a final position the pins of an IC package engage with corresponding contacts of the ZIF socket. Therefore, the slidable covers are apt to move whereby the pins of the IC package may disengage from the contacts of the ZIF sockets when an exterior force is exerted on the ZIF socket.

Another conventional ZIF socket without a cam lever is disclosed in U.S. Pat. No. 4,988,310. The socket includes a base housing and a cover slidably mounted on the housing which drives pins of an IC package to electrically engage with corresponding contact elements disposed in the base housing. The socket further comprises a spring fixed in a slot defined in a lateral side of the base with legs extending into a corresponding slot defined in the cover. When the cover is moved by an external tool, the spring is biased to allow the pins of an IC package to engage with the contact elements of the socket. Since the inserting force exerted on the pins of the IC package by all the contacts is much greater than the biasing force exerted by the spring, the cover can not disengage from the pins without assistance from an external force provided by the socket.

The biasing force exerted by the spring can be balanced by some of the force exerted on the pins of the IC package by the contacts. However, the biasing force reduces a normal force exerted on the pins by the contacts thereby increasing contact impedance between the pins and the corresponding contacts. Thus, poor electrical connection quality will result.

BRIEF SUMMARY OF THE INVENTION

A main object of the present invention is to provide a ZIF socket having a retention member for ensuring proper electrical engagement and disengagement between pins of a mating IC package and contacts of the present invention.

Another object of the present invention is to provide a ZIF socket having a retention member for ensuring proper contact forces between pins of an IC package and contacts of the ZIF socket thereby achieving an excellent electrical connection between the ZIF socket and the IC package.

In order to achieve the object set forth, a ZIF socket in accordance with the present invention comprises a dielectric base retaining a plurality of contacts therein, a slidable cover, and a resilient retention member mounted between the base and the slidable cover. The base forms first and second platforms outwardly projecting from opposite lateral sides thereof for providing the cover a moving space to slide along a top surface of the base. The second platform defines an access cavity in a top face thereof for insertion of a tool being to operate the cover to slide along the top surface of the base, a receiving slot proximate the access cavity, a groove proximate the receiving slot, and a recess communicating with the access cavity, the groove and the receiving slot. The recess cooperates with the receiving slot for receiving the retention member therein. A block extends from an outer lateral edge of the second platform for cooperation with a side wall of the first platform to define the moving space. The cover also defines a cutout corresponding to the access cavity of the base, and a retention section corresponding to the receiving slot of the base for engaging with the resilient retention member.

The resilient retention member comprises a main body disposed in the recess of the base, a retention portion extending through the receiving slot of the base into the retention section of the cover, a pressing portion partially extending into the access cavity, and a positioning portion extending into the groove. The positioning portion forms a barb on a lateral face for securely engaging within a notch defined in an inner side wall of the groove of the base. When an external tool is inserted through the cutout of the cover into the access cavity of the base to press the pressing portion of the retention member, the pressing portion and the main body simultaneously occur elastic deformations and downwardly pivotally move about the barb of the positioning portion. Thus, the retention member is driven to deflect and releases the cover whereby the cover can be driven to slide along the upper surface of the base for allowing pins of a mating IC package to engage with the corresponding contacts mounted in the base. When the tool is removed from the access cavity of the base, the main body and the pressing portion will recover from the elastic deformations while the retention portion of the retention member engages again with the retention section of the cover thereby locking the cover and the base together.

Other objects, advantages and novel features of the invention will become more apparent from the following detailed description when taken in conjunction with the accompanying drawings.

DETAILED DESCRIPTION OF THE INVENTION

Figure 1:
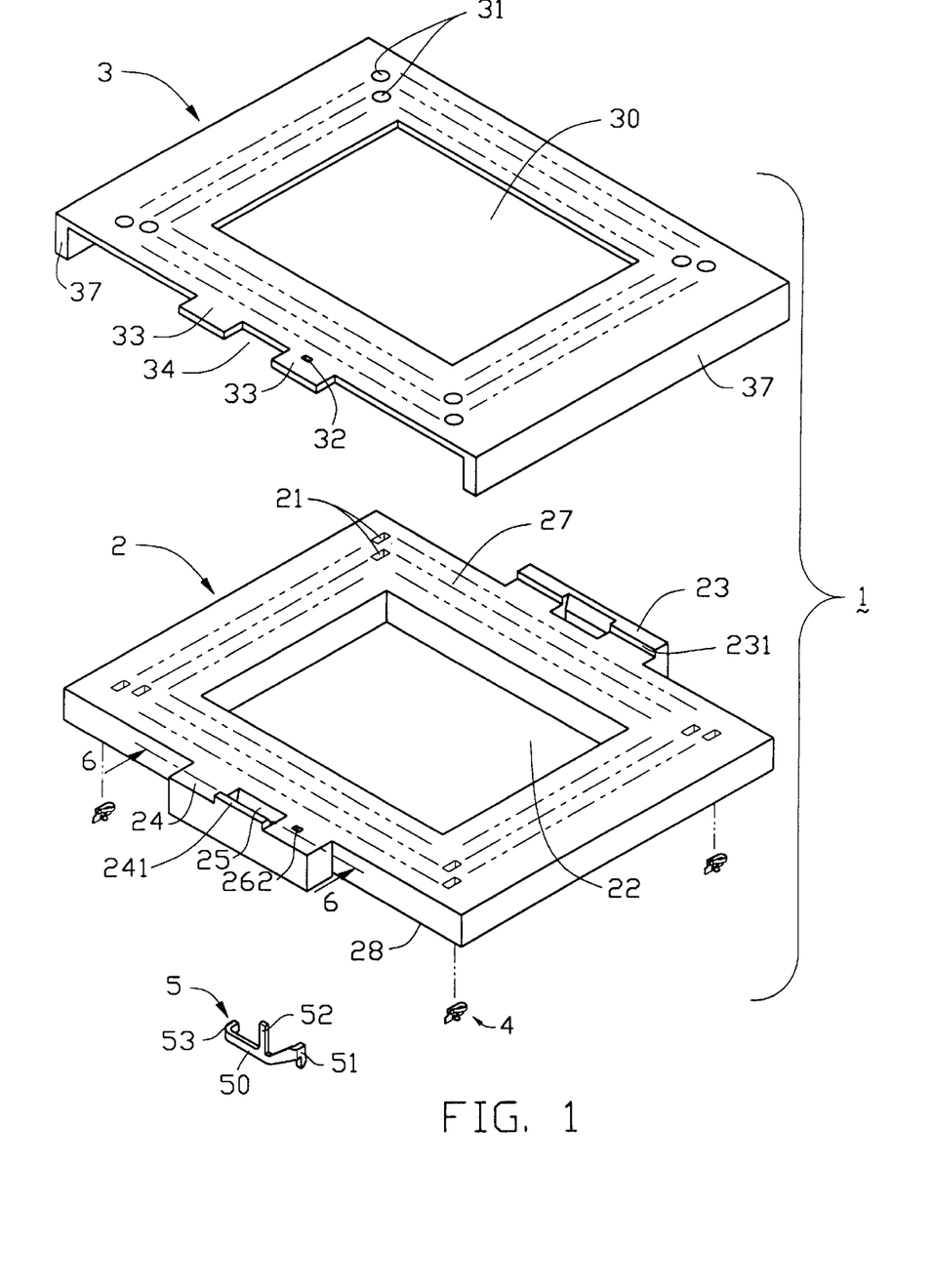
FIG. 1 is an exploded view of a ZIF socket of the present invention.
Figure 2:
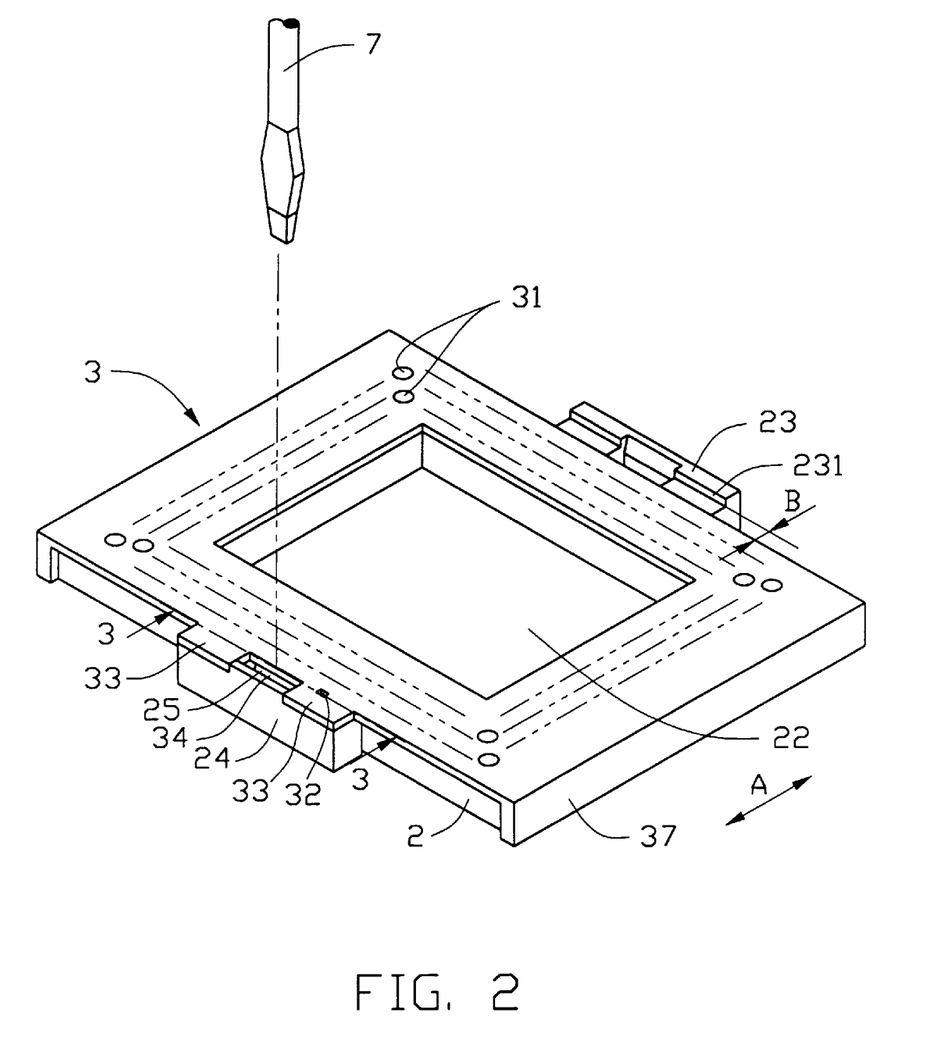
FIG. 2 is an assembled view of FIG. 1.
Figure 6:
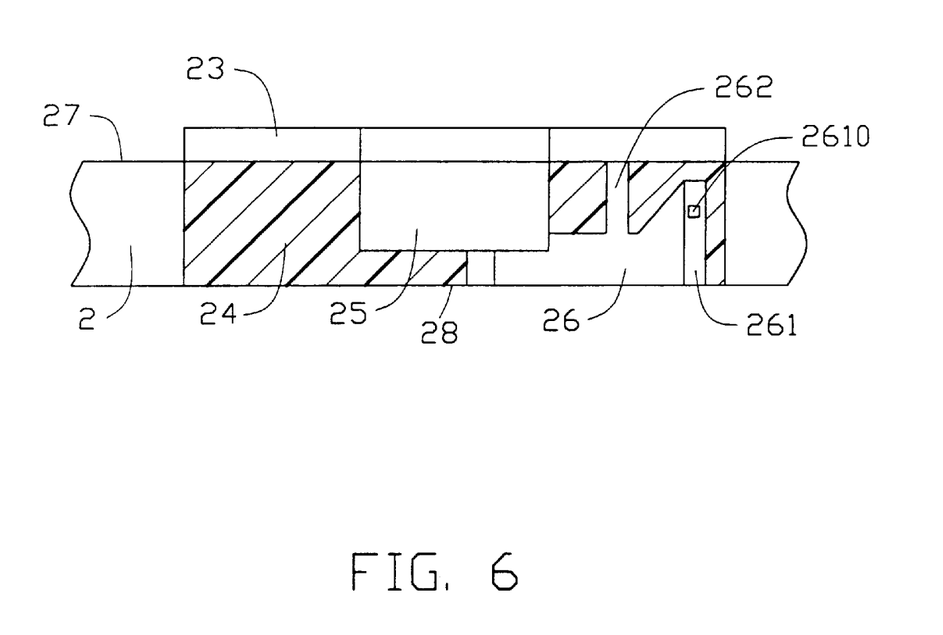
FIG. 6 is similar to FIG. 3 of a base taken along line 6—6 of FIG. 1.

Referring to FIGS. 1, 2 and 6, a zero insertion force (ZIF) socket 1 comprises a dielectric base 2, a slidable cover 3 mounted to a top surface 27 of the base 2, a plurality of contacts 4 received in the base 2, and a resilient retention member 5 fixed in the base 2. The base 2 is rectangular and defines an opening 22 in a middle thereof and a plurality of contact receiving passageways 21 therein for receiving the corresponding contacts 4.

First and second platforms 23, 24 outwardly extend from opposite sides of the base 2, and each platform 23, 24 has a top face (not labeled) flush with a top surface 27 of the base 2. The second platform 24 defines an access cavity 25 in the top face thereof for insertion of an external tool, a groove 261 proximate the access cavity 25, a receiving slot 262 in the top face between the access cavity 25 and the groove 261 for engaging with the retention member 5, and a recess 26 in the top face of the second platform 24 communicating with the access cavity 25 for insertion of the retention member 5, the groove 261 and the receiving slot 262. A block 241 upwardly extends from a lateral edge of the second platform 24. The first platform 23 forms a side wall 231 for cooperating with the block 241 of the first platform 24 to define a moving space (not labeled) in which the cover 3 is movable.

The cover 3 also defines an opening 30 in a middle thereof and a plurality of pin receiving passageways 31 therein for receiving pins of a mating IC package. A pair of abutting flanges 37 extends from opposite sides of the cover 3 for abutting against corresponding sides of the base 2 thereby limiting movement of the cover 3 perpendicular to a direction "A". A pair of tabs 33 extends from an edge of the cover 3 for covering the second platform 24 thereby positioning the cover 3 at a first position. A cutout 34 is defined between the tabs 33 corresponding to the access cavity 25 of the base 2. A retention section 32 is defined in one of the tabs 33 corresponding to the receiving slot 262 of the base 2 for engaging with the retention member 5. The retention section 32 can either be a slot or a recess. If the retention section 32 is a recess, the recess is exposed to a bottom surface of the cover 3. When the tabs 33 are positioned on the first platform 24, a distance "B" is defined between an edge of the cover 3 opposite the tabs 33 and the side wall 231 of the first platform 23 for allowing the cover 3 to smoothly slide along the top surface 27 of the base 2.

Figure 4:
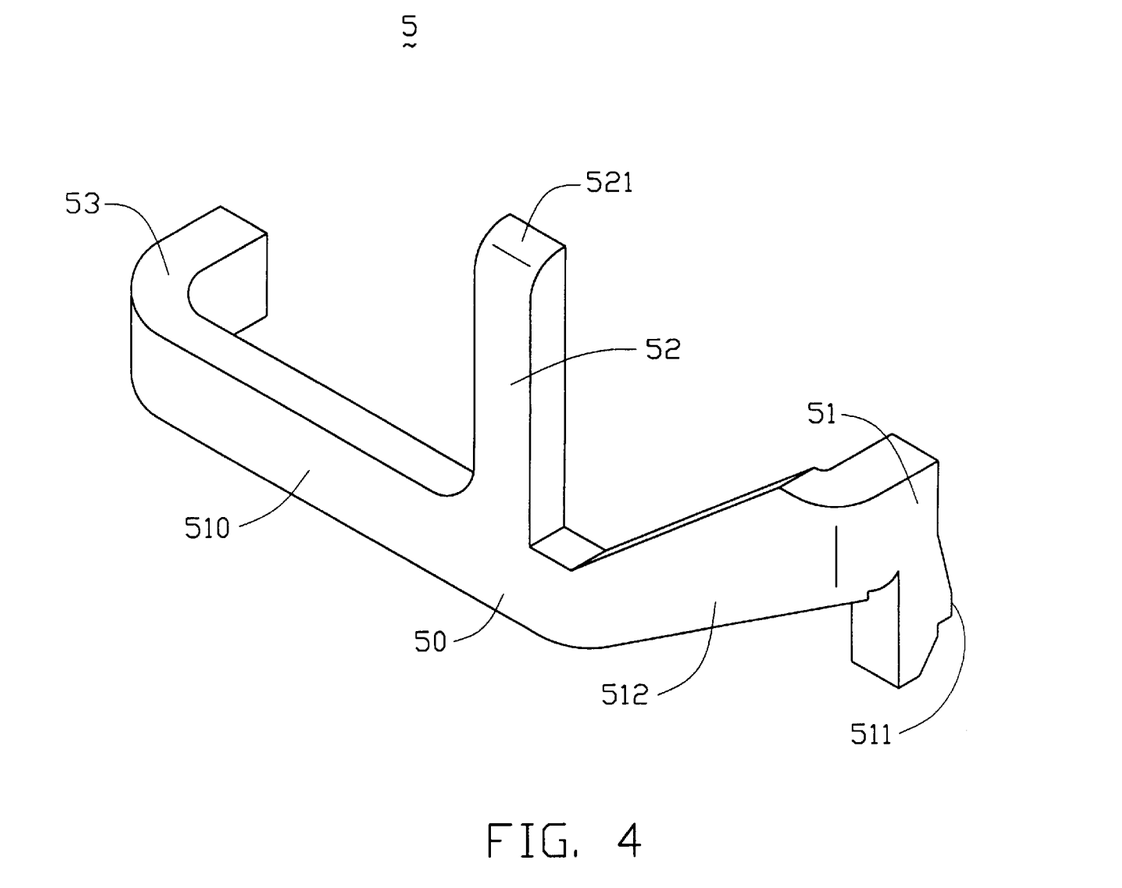
FIG. 4 is a perspective view of a retention member of the present invention.
Figure 5:
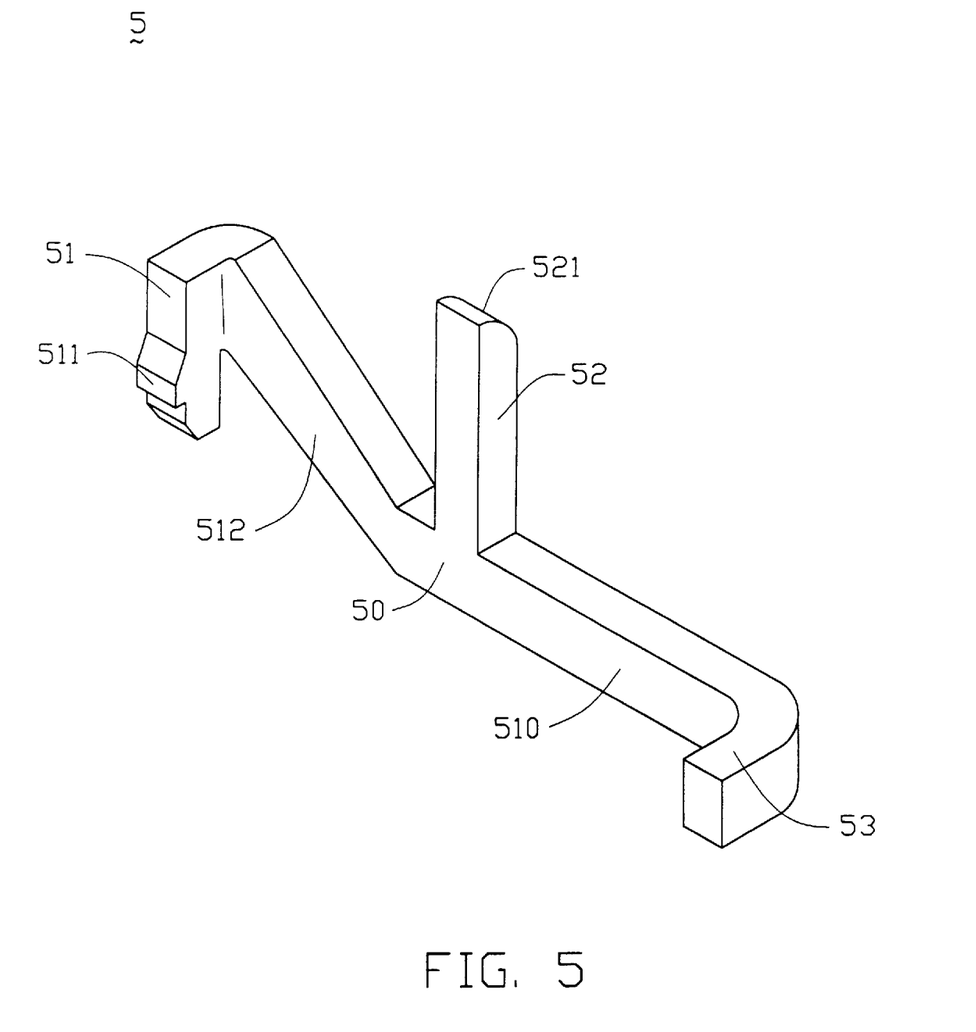
FIG. 5 is another perspective view of the retention member of FIG. 4.

Referring also to FIGS. 4 and 5, the retention member 5 is made of dielectric material or metal material or other suitable material having appropriate resiliency. The retention member 5 comprises a main body 50, a positioning portion 51 downwardly extending from a free end of the main body 51 for engaging within the groove 261 of the base 2, a retention portion 52 upwardly extending from a middle of the main body 51 for insertion into the receiving slot 262 of the base and the retention section 32 of the cover 3, and a pressing portion 53 outwardly extending from the other free end of the main body 51 opposite and perpendicular to the positioning portion 51 for being pressed by an external tool 7 to engage or disengage the retention member 5 with the cover 3. The pressing portion 23, the retention portion 52, and the positioning portion 51 are all perpendicular to each other. The main body 50 has a straight portion 510 for connecting the pressing portion 53 with the retention portion 52, and an inclined portion 512 formed between the retention portion 52 and the positioning portion 51. The retention portion 52 forms an arcuate surface 521 at a free end thereof for facilitating insertion of the retention portion 52 into the retention section 32 of the cover 3. The positioning portion 51 forms a barb 511 for securely engaging within a notch 2610 defined in an inner side wall of the groove 261 of the base 2.

Figure 3:
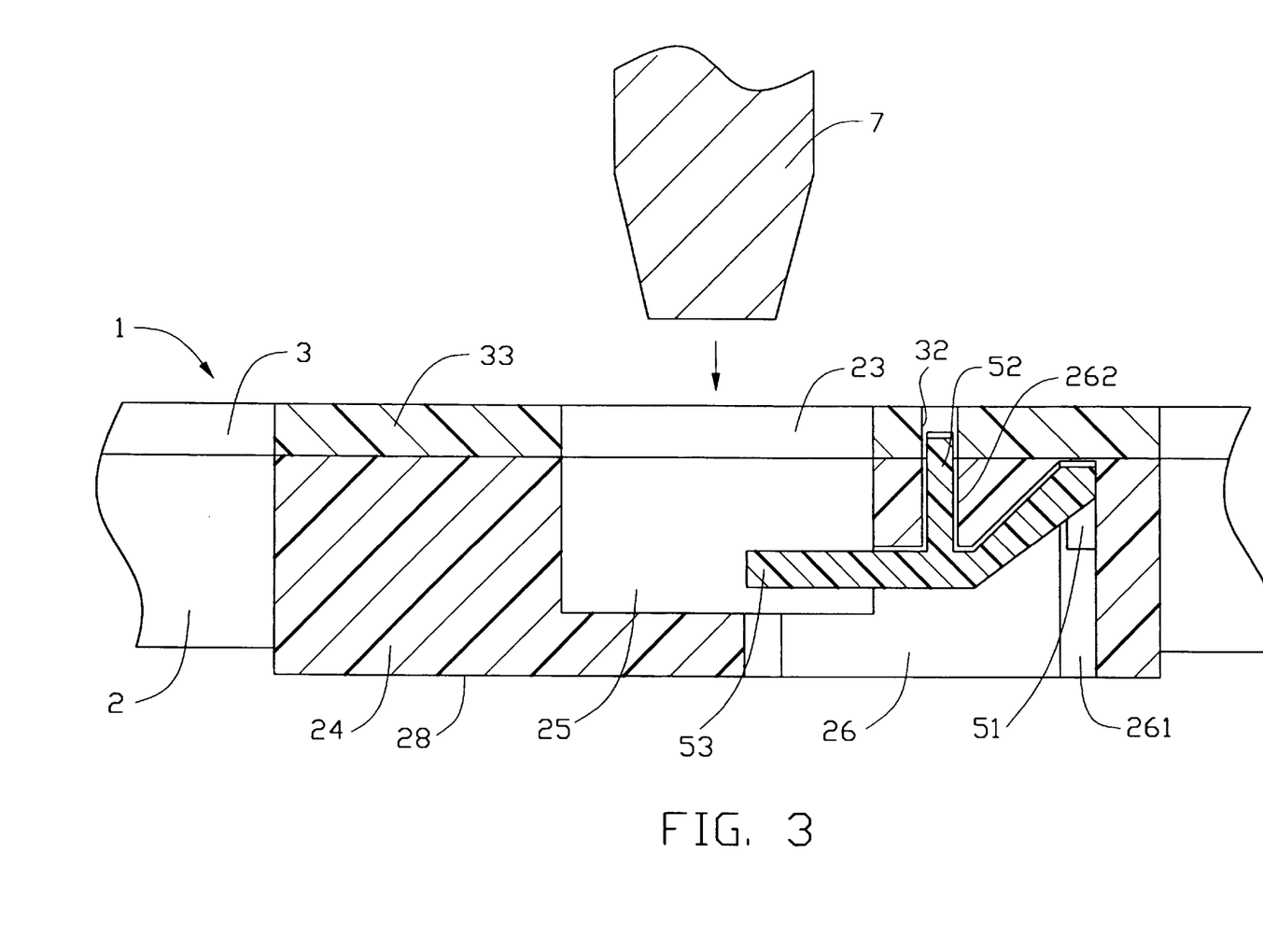
FIG. 3 is a cross-sectional view taken along line 3—3 of FIG. 2.
Figure 7:
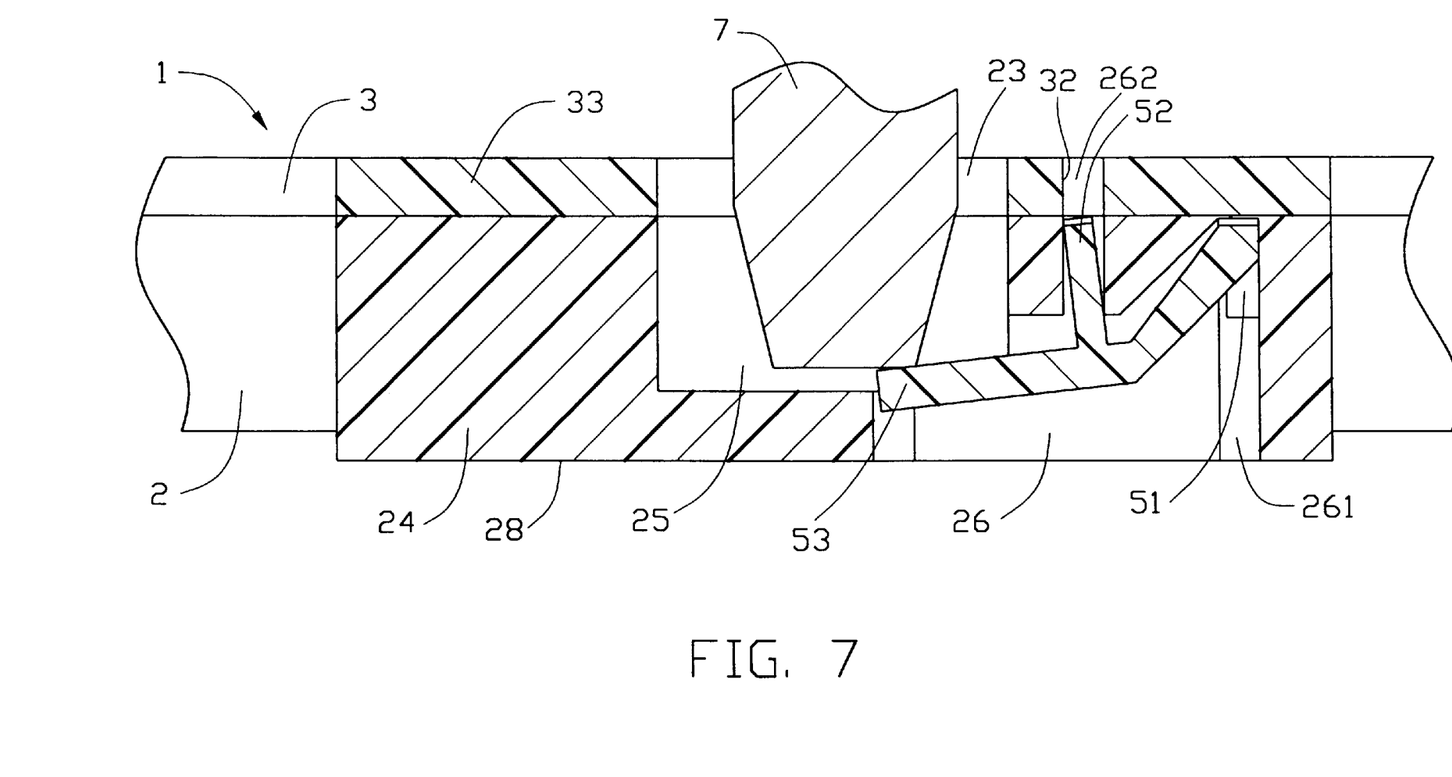
FIG. 7 is a cross-sectional view showing a tool being operated to move the retention member fixed in the ZIF socket.

Referring further to FIGS. 3 and 7, in assembly, the contacts 4 are inserted in the corresponding contact receiving passageways 21 of the base 2. The cover 3 is disposed on the top surface 27 of the base 2. The tabs 33 are aligned with the second platform 24, while the retention section 32 is aligned with the receiving slot 262 of the base 2. An IC package (not shown) is then positioned on the cover 3 so that pins of the IC package extend through the corresponding pin passageways 31 of the cover 3 into the corresponding contact receiving passageways 21 of the base 2 but do not electrically engage the contacts 4. The IC package and the cover 3 are then driven to move the distance "B" in the direction "A". Thus, the pins of the IC package electrically contact the corresponding contacts 4 received in the contact receiving passageways 21.

The retention member 5 is then fixed in the recess 26 from the bottom surface 28 of the base 2. The pressing portion 53 extends into the access cavity 25, the retention portion 52 extends through the receiving slot 262 of the base 2 into the retention section 32 of the cover 3, while the positioning portion 51 is disposed in the groove 261 and abuts against the inner side walls of the groove 261. The barb 511 securely engages within the notch 2610. Thus, the cover 3 and the IC package are secured to the base 2 with the pins of the IC package contacting the corresponding contacts 4.

To remove the IC package, the external tool 7 is required. The barb 511 of the positioning portion 51 works as a pivot about which the retention member 5 pivotally moves within the base 2. The tool 7 is operated to downwardly press the pressing portion 53 of the retention member 5, the main body 50 and the pressing portion 53 will occur resilient deformations and is simultaneously driven to pivotally downwardly move about the barb 511 of the positioning portion 51, while the retention portion 52 is driven to deflect and withdrawn from the retention section 32 of the cover 3, and the positioning portion 51 remains still within the groove 261. The receiving slot 262 of the base 2 is large enough for deflections of the retention portion 52 of the retention member 5 therein. Thus, the cover 3 and the IC package are released to move along the top surface 27 of the base 2 in the direction "A".

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A zero insertion force (ZIF) socket comprising:
a dielectric base having a top surface, a bottom surface, a plurality of contact receiving passageways defined between the top surface and the bottom surface, an access cavity defined in the top surface, a receiving slot exposed to the top surface, a recess defined in the bottom surface and communicating with both the access cavity and the receiving slot, and a groove defined in the bottom surface and communicating with the access cavity, the receiving slot and the recess;

a plurality of contacts received in the corresponding contact receiving passageways;

a dielectric cover slidably mounted to the top surface of the dielectric base, the dielectric cover comprising a plurality of pin receiving passageways, and a retention section; and a resilient retention member being inserted into the dielectric base via the recess, the resilient retention member comprising a main body, a pressing portion formed at an end of the main body and extending into the access cavity, a retention portion extending from a middle of the main body for insertion through the receiving slot of the dielectric base to engage with the retention section of the dielectric cover thereby preventing the dielectric cover from a sliding movement relative to the dielectric base, and a positioning portion formed at the other end of the main body opposite the pressing portion and engaging within the groove, the pressing portion being externally operable to resiliently move downwards to disengage the retention portion from the retention section of the dielectric cover.

2. The ZIF socket as claimed in claim 1, wherein a platform outwardly extends from a lateral side of the dielectric base, and wherein the access cavity, the receiving slot and the groove are all defined in the platform.

3. The ZIF socket as claimed in claim 2, wherein: a tab outwardly extends from an edge of the dielectric cover corresponding to the platform; and the retention section is defined in the tab.

4. The ZIF socket as claimed in claim 1, wherein: the positioning portion of the retention member forms a barb on a lateral surface; and the groove of the dielectric base defines a notch for securely receiving the barb of the retention member.

5. The ZIF socket as claimed in claim 1, wherein the retention portion forms an arcuate surface at a free end thereof for guiding the retention portion into the receiving slot of the dielectric base and the retention section of the dielectric cover.

6. The ZIF socket as claimed in claim 1, wherein the retention section of the dielectric cover is a slot.

7. The ZIF socket as claimed in claim 1, wherein the retention section of the dielectric cover is a recess exposed to a bottom surface of the dielectric cover.

8. A zero insertion force (ZIF) socket assembly comprising:

a dielectric base defining a top surface and a bottom surface, a plurality of contact receiving passageways extending therebetween, an access cavity and a receiving slot defined in the base and extending through the top surface for exposure to an exterior;

a plurality of contacts received within the corresponding contact receiving passageways, respectively;

a dielectric cover slidably mounted to the top surface of the dielectric base, said cover defining a plurality of pin receiving passageways and a retention section;

a retention member disposed within the base, said retention member including a pressing portion and a retention portion positioned in the corresponding access cavity and receiving slot, respectively, said retention portion further extending upwardly into the cover and engaging the retention section thereof for locking the cover in position with regard to the base; and a tool inserted into the access cavity and operable to horizontally move the cover with regard to the base wherein the pressing portion is pressed downwardly by the tool and actuates the retention portion to also downwardly move and disengage from the retention section for allowing movement of the cover with regard to the base.

* * * * *